United States Patent
Inamori (10) Patent No.: US 6,272,191 B1
(45) Date of Patent: Aug. 7, 2001

(54) INFORMATION RECEIVING SYSTEM AND AN INFORMATION RECEIVING METHOD USING SUCH A SYSTEM

(75) Inventor: Nobuya Inamori, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 09/418,194

(22) Filed: Oct. 13, 1999

Related U.S. Application Data (63) Continuation of application No. 08/925,802, filed on Sep. 9, 1997.

(51) Int. Cl.[7] ....................................................... H03D 1/06
(52) U.S. Cl. ........................ 375/348; 375/347; 455/140
(58) Field of Search ..................................... 375/347, 348, 375/285, 316, 346; 455/132, 136, 138, 140, 180.1, 179.1, 185.1, 191.1, 345, 150.1, 161.2, 296; 370/282, 278, 286

(56) References Cited

U.S. PATENT DOCUMENTS

| | | |
|---|---|---|
| 5,159,707 | 10/1992 | Mogi et al. . |
| 5,179,719 | 1/1993 | Hidaka . |
| 5,239,697 | 8/1993 | Kosuga . |
| 5,303,400 | 4/1994 | Mogi . |
| 5,457,815 | 10/1995 | Morewitz, II . |
| 5,557,603 | 9/1996 | Barlett et al. . |
| 5,584,051 | 12/1996 | Goken . |
| 5,687,162 | 11/1997 | Yoshida et al. . |
| 5,722,058 * | 2/1998 | Umemoto et al. ................... 455/140 |
| 5,740,523 * | 4/1998 | Nakajima et al. ................ 455/186.1 |
| 5,774,798 * | 6/1998 | Gaskill .............................. 455/186.1 |
| 5,809,090 * | 9/1998 | Buternowsky et al. ............. 375/347 |

FOREIGN PATENT DOCUMENTS

| | | |
|---|---|---|
| 30 34 155 | 3/1982 | (DE) . |
| 0 595 314 | 5/1994 | (EP) . |

* cited by examiner

Primary Examiner—Chi Pham
Assistant Examiner—Emmanuel Bayard
(74) Attorney, Agent, or Firm—Anthony J. Casella; Gerald E. Hespos; Michael J. Porco (57) ABSTRACT

A system is provided to prevent the generation of radio waves of local oscillation from an FM multiplex receiver 11 within a frequency band which adversely affects an FM radio 12 without providing an isolation buffer. The FM multiplex receiver 11 and the FM radio 12 are connected via a main controller 13. The main controller 13 discriminates whether or not the FM radio 12 is on. In the case that the FM radio 12 is on, the main controller 13 controls the tuning of the FM multiplex receiver 11 lest the tuning frequency of the FM multiplex receiver 11 should be set to a specified prohibited frequency.

6 Claims, 5 Drawing Sheets

INFORMATION RECEIVING SYSTEM AND AN INFORMATION RECEIVING METHOD USING SUCH A SYSTEM

This application is a continuation of application Ser. No. 08/925,802 filed Sep. 9, 1997.

BACKGROUND OF THE INVENTION

1. Field of the Invention

The present invention relates to an information receiving system, in particular to a broadcast receiving system, capable of receiving two kinds of information or broadcast radio waves. The broadcast receiving system may receive an FM radio broadcast and a FM multiplex broadcast for superimposedly displaying traffic information on a monitor displaying a road map. Furthermore the present invention relates to an information receiving method, in particular to a broadcast receiving method, using the inventive information receiving system.

2. Description of the Prior Art

Figure 6:
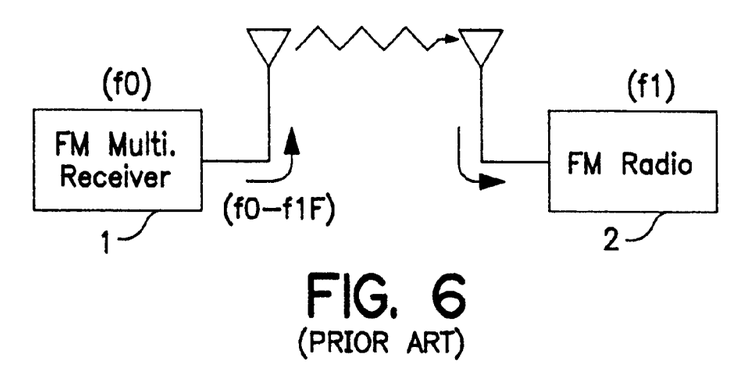
FIG. 6 is a diagram showing the principle of a prior art broadcast receiving system.

In a system wherein an FM multiplex receiver and an FM radio are constructed by two tuners, basic function elements of the FM multiplex receiver 1 and the FM radio 2 are provided independently of each other as shown in FIG. 6. Accordingly, there is no correlation between a tuning frequency (multiplex receiving frequency) f0 of the FM multiplex receiver 1 and a tuning frequency (radio frequency) f1 of the FM radio 2.

Generally, in a superheterodyne receiver, though to a very small extent, local oscillation caused when a specific receiving frequency is selected is leaked as noise radio waves from an antenna or the like.

For example, when fIF in FIG. 6 denotes an intermediate frequency of the FM multiplex receiver 1 and the relationship between the multiplex receiving frequency f0 and the radio frequency f1 is defined as f0−fIF=f1, if an electric field intensity from an FM radio station is weak, it is added onto a local oscillation frequency (f0−fIF) leading from the antenna of the FM multiplex receiver 1, with the result that noise is included in the sounds from the FM radio 2. In other words, the condition f0≠f1+fIF should be met, in order to avoid the generation of noise.

Figure 7:
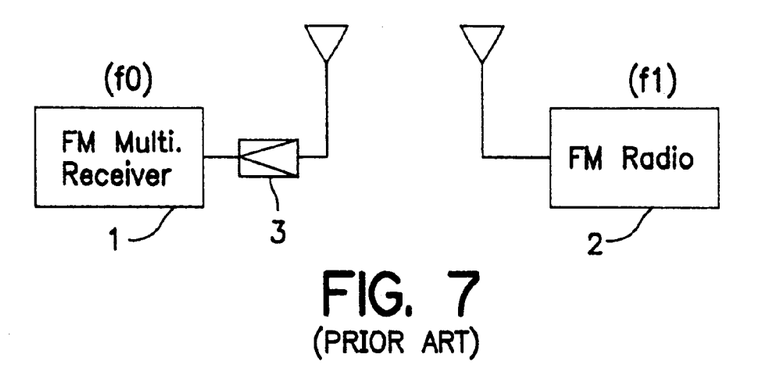
FIG. 7 is a diagram showing the principle of another prior art broadcast receiving system.

In order to mitigate the above problem, in a prior art system, an isolation buffer 3 is provided between the FM multiplex receiver 1 and the FM multiplex antenna, as shown in FIG. 7, to attenuate the local oscillation leaking from the FM multiplex receiver 1, thereby reducing an influence on the FM radio 2.

By attenuating the noise acting in a direction opposite to a normal direction by providing the isolation buffer 3 as described above, if the level of the local oscillation leaking from the FM multiplex receiver 1 is, for example, −60 dBm, the level of the noise leaking from the antenna is suppressed to −100 dBm or lower if the isolation level of the isolation buffer 3 is 40 dBm. As a result, the leakage of the local oscillation gives almost no influence on the FM radio 2.

However, the external provision of the isolation buffer 3 complicates the system. Even if the isolation buffer 3 is provided in the FM multiplex receiver 1, it similarly leads to a larger receiving system.

An object of the present invention is to provide an information receiving system capable of eliminating the influence of noise due to the leakage of local oscillation without additionally providing an isolation buffer, and an information receiving method using such a system.

SUMMARY OF THE INVENTION

According to the invention, there is provided an information or data receiving system, in particular for a broadcast receiving system, comprising a first information or data receiver for receiving a first information or data radio wave or electromagnetic wave, a second information or data receiver for receiving a second information or data radio wave or electromagnetic wave, and a control unit for controlling the first and second information receivers. The control unit has a function of discriminating whether or not the second information receiver is on. If the controller determines that the second information receiver is on, then the controller controls the tuning of the first information receiver to avoid having a tuning frequency of the first information receiver set to a specified frequency that is prohibited in cases when the second information receiver is on.

According to the present invention, whether or not the second information or broadcast receiver is on is discriminated. In the case that the second information or broadcast receiver is on, the tuning of the first information or broadcast receiver is controlled lest the tuning frequency of the first information or broadcast receiver should be set to the specified prohibited frequency. Accordingly, the generation of radio waves of the local oscillation from the first information or broadcast receiver, within a frequency band which adversely affects the second information or broadcast receiver can securely be prevented, thereby preventing radio wave noise from being induced in the second information or broadcast receiver. Particularly, since there is no need to provide an isolation buffer at the first information or broadcast receiver as in the prior art, the information or broadcast system is effectively prevented from becoming larger.

According to a preferred embodiment of the invention, the control unit may comprise storage means for storing, as a prohibited frequency, a first tuning frequency of the first information receiver which adversely affects or may affect the second information radio wave reception of the second information receiver, in particular by local oscillation generated during the reception of the first information radio wave. The control unit may also comprise discriminator means for discriminating whether or not the second information receiver is on. The control unit may further comprise a multiplex tuning controller for controlling the tuning of the first information receiver lest the tuning frequency of the first information receiver should be set to the prohibited frequency, in particular stored in the storage means, in the case that the second information receiver is on.

Preferably the control unit discriminates whether the tuning frequency (f1) has exceeded an upper limit frequency (fH), i.e. f1>fH and sets the tuning frequency to a lower limit frequency if this is the case, (i.e., in situations where a stepwise frequency change amount by which the tuning frequency is changed is positive). Alternatively or additionally, the control unit may discriminate whether the tuning frequency (f1) has exceeded a lower limit frequency (fL), i.e. f1<fL, and sets the tuning frequency to an upper limit frequency if this is the case, (i.e., in situations where a stepwise frequency change amount by which the tuning frequency is changed is negative). Thus it is avoided that the tuning frequency is set to a value outside of a desired range of frequencies, in particular the range of frequencies of the FM radio broadcast and/or of the FM multiplex broadcast.

Most preferably, the first information receiver is an FM multiplex receiver for receiving an FM multiplex information radio wave, in particular a FM multiplex broadcast radio wave including a traffic information, and the second information receiver is a radio for receiving at least an FM radio information radio wave, in particular an FM radio broadcast radio wave.

According to the invention, there is further provided an information receiving method. The broadcast receiving method may be for use in the information receiving system described above. The method may comprise a first discriminating whether or not the second information receiver is on. The method may then comprise a step of discriminating whether or not the tuning frequency of the first information receiver is equal to the prohibited frequency. The prohibited frequency may be stored in a storage means. The method may then include changing the tuning frequency in the case that the second information receiver is on. Finally the method may include varying the tuning frequency in the case that the tuning frequency is equal to the prohibited frequency, preferably stored in the storage means.

According to a preferred embodiment of the invention, the step of varying the tuning frequency is performed in a continuous and/or stepwise manner.

Preferably, the step of varying the tuning frequency is performed by adding or substracting a specified frequency change amount (e.g. 0.1 MHz) to or from the tuning frequency.

Further preferably, the method according to the invention further comprises the steps of discriminating whether the tuning frequency (f1) of the first information receiver has exceeded an upper limit frequency (fH), i.e. f1>fH, and setting the tuning frequency to a lower limit frequency (fL) if this is the case, in case a stepwise frequency change amount by which the tuning frequency is changed is positive and/or discriminating whether the tuning frequency (f1) of the first information receiver has exceeded a lower limit frequency (fL), i.e. f1<fL, and sets the tuning frequency to an upper limit frequency (fH) if this is the case, in case a stepwise frequency change amount by which the tuning frequency is changed is negative.

Further preferably, the information receiving method further comprises the step of discriminating whether the tuning frequency (f1) of the first information receiver has exceeded a limit frequency, i.e. f1>fH and/or f1<fL, and setting the tuning frequency to the limit frequency if this is the case.

Still further preferably, the information receiving method further comprises the steps of obtaining the tuning frequency of the second information receiver and calculating the prohibited frequency or the prohibited frequency range based on the thus obtained tuning frequency. Thus a flexible way of avoiding noise generation is provided.

Most preferably, the information receiving method further comprises the step of renewably storing the thus calculated prohibited frequency in the storage means.

According to further preferred embodiment, there is provided a broadcast receiving system, comprising a first broadcast receiver for receiving a first broadcast radio wave, a second broadcast receiver for receiving a second broadcast radio wave, and a control unit for controlling the first and second broadcast receivers. The control unit has a function of discriminating whether or not the second broadcast receiver is on and controlling the tuning of the first broadcast receiver lest a tuning frequency of the first broadcast receiver should be set to a specified prohibited frequency in the case that the second broadcast receiver is on.

The control unit preferably comprises storage means for storing, as a prohibited frequency, a first tuning frequency of the first broadcast receiver which adversely affects the second broadcast radio wave reception of the second broadcast receiver by local oscillation generated during the reception of the first broadcast radio wave. The control unit further comprises discriminator means for discriminating whether or not the second broadcast receiver is on, and multiplex tuning controller for controlling the tuning of the first broadcast receiver lest the tuning frequency of the first broadcast receiver should be set to the prohibited frequency stored in the storage means in the case that the second broadcast receiver is on.

Specifically, the first broadcast receiver is an FM multiplex receiver for receiving an FM multiplex broadcast radio wave such as traffic information and the second broadcast receiver is a radio for receiving at least an FM radio broadcast radio wave.

During the broadcast reception, whether or not the second broadcast receiver is on is discriminated. In the case that the second broadcast receiver is on, whether or not the tuning frequency of the first broadcast receiver is equal to the prohibited frequency stored in the storage means is discriminated while varying the tuning frequency. In the case that the tuning frequency is equal to the prohibited frequency stored in the storage means, the tuning frequency is varied by adding or substracting a specified frequency change amount to or from the tuning frequency.

These and other objects, features and advantages of the present invention will become more apparent upon a reading of the following detailed description and accompanying drawings.

BRIEF DESCRIPTION OF THE DRAWINGS

FIGS. 3(*a*) and 3(*b*) are charts showing the tuning of a multiplex receiver and of a radio in the broadcast receiving system.

DETAILED DESCRIPTION OF THE PREFERRED EMBODIMENTS

Figure 1:
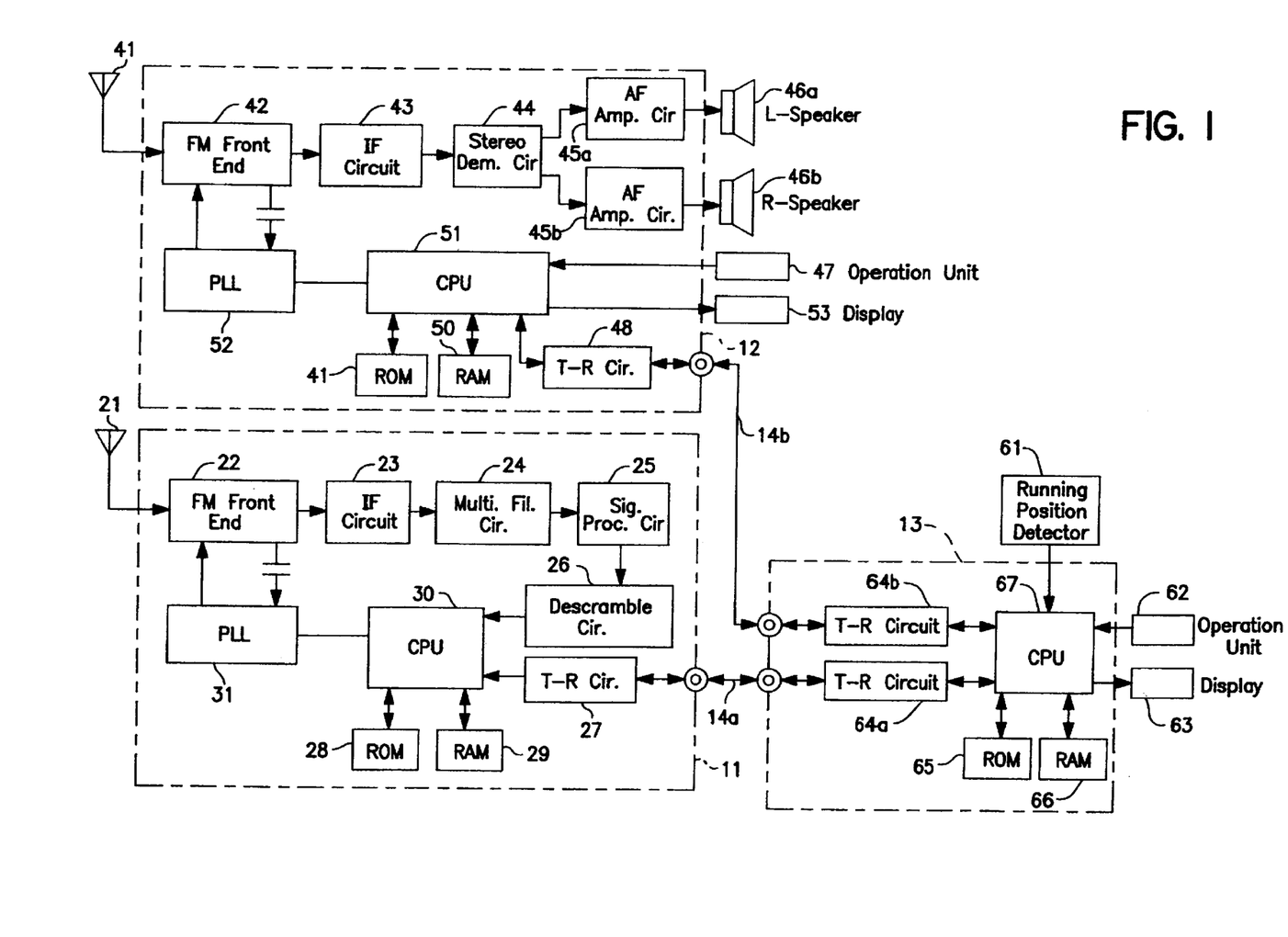
FIG. 1 is a block diagram of an entire broadcast receiving system according to one embodiment of the invention.

FIG. 1 is a block diagram of an entire information or broadcast receiving system according to one embodiment of the invention. As shown in FIG. 1, the broadcast receiving system includes an FM multiplex receiver 11 as a first information or data or broadcast receiver and an FM radio 12 as a second information or data or broadcast receiver connected by buses 14a, 14b via a main controller 13 (control unit). The tuning state of the FM radio 12 is recognized by the main controller 13 and the FM multiplex receiver 11 so that the FM multiplex receiver 11 will not select a signal having a frequency higher than a tuning frequency f1 of the FM radio 12 by an intermediate frequency fIF of the FM multiplex receiver 11.

The FM multiplex receiver 11 includes an antenna 21, an FM front end 22, an IF circuit 23, a multiplex filter circuit 24, a signal processing circuit 25, a descramble or unscramble circuit 26, a transmit-receive circuit 27, a ROM 28 or the like permanent data storage, as a CD-ROM, magnetic storage etc., a RAM 29 or the like renewable storage, a CPU 30, and a PLL (phase-locked loop) circuit 31. The FM front end 22 receives an FM multiplex broadcast radio wave received by the antenna 21. The IF circuit 23 detects an FM multiplex signal converted into an IF signal by the FM front end 22. The multiplex filter circuit 24 detects or determines the presence or absence of the signal from an FM multiplex broadcasting station among the received signals, preferably by extracting only the FM multiplex signals from the detected signals. The signal processing circuit 25 demodulates the extracted FM multiplex signals while preferably correcting errors and takes out packet data included in the demodulated signals. The descramble circuit 26 descrambles the packet data. The transmit-receive circuit 27 transmits and receives the signals to and from the bus 14a. The CPU 30 is connected with the ROM 28 and the RAM 29 and processes the signals from the descramble circuit 26 and the transmit-receive circuit 27. The PLL circuit 30 controls a receiving frequency in cooperation with the FM front end 22 in accordance with a command from the CPU 30.

The FM radio 12 includes an antenna 41, an FM front end 42, an IF circuit 43, a stereo demodulating circuit 44, AF amplifying circuits 45a, 45b, L- and R-speakers 46a, 46b, a transmit-receive circuit 48, a ROM 49 or the like permanent storage, a RAM 50 or the like renewable storage, a CPU 51 and a PLL circuit 52. The FM front end 42 receives an FM radio broadcasting radio wave received by the antenna 41. The IF circuit 43 detects an FM radio broadcast signal converted into an IF signal by the FM front end 42. The stereo demodulating circuit 44 extracts FM stereo signals from the detected signals. The AF amplifying circuits 45a, 45b amplify L- and R-signals of the extracted FM stereo signals. The L- and R-speakers 46a, 46b output the amplified signals as audio signals. The transmit-receive circuit 48 transmits and receives the signals to and from the bus 14b.

The CPU 51 is connected with the ROM 49 and the RAM 50, processes signals received from an operation unit 47 provided e.g. at a front panel of a vehicle, and transmits a specified information such as a receiving frequency to a display 53 to display it thereon. The PLL circuit 52 controls a receiving frequency in cooperation with the FM front end 42 in accordance with a command from the CPU 51.

The main controller 13 controls the entire broadcast receiving system and is connected with a running position detector 61 for detecting a running position of the vehicle, an operation unit 62 for inputting a variety of commands and necessary data for the vehicle navigation and a display 63 for showing a road map, a traffic information and the like to a driver. The main controller 13 includes first and second transmit-receive circuits 64a, 64b, a ROM 65 or the like permanent storage, a RAM 66 or the like renewable storage, and a CPU 67. The transmit-receive circuits 64a, 64b permit the FM multiplex receiver 11 and the FM radio 12 to transmit and receive the signals to and from each other via the buses 14a, 14b. The CPU 67 is connected with a storage means constructed by the ROM 65 and the RAM 66, processes a variety of signals received from the transmit-receive circuits 64a, 64b and the operation unit 62 to control the FM multiplex receiver 11 and the FM radio 12 and transmits signals representing the road map, traffic information and the like to the display 63 to display the information on the display 63.

Figure 2:
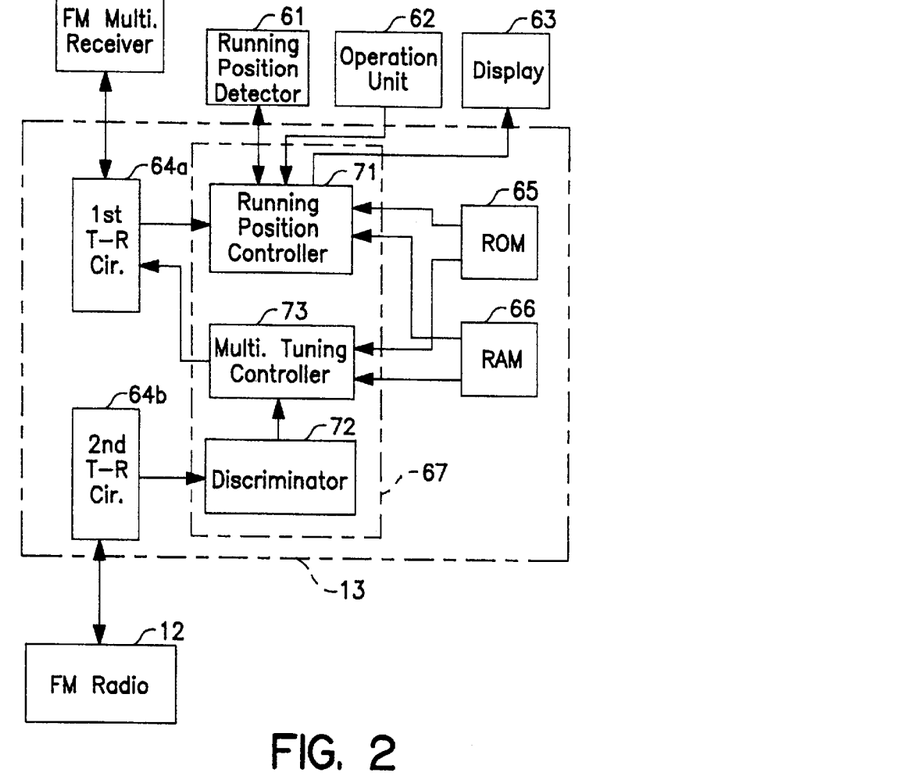
FIG. 2 is a block diagram mainly showing the internal construction of a navigation system main body of the broadcast receiving system.

The CPU 67 outputs an information or data, e.g. a navigation information, etc. to the display 63 and centrally controls the FM multiplex receiver 11 and the FM radio 12. As shown in FIG. 2, the CPU 67 includes a running position controller 71, a discriminator 72 and a multiplex tuning controller 73. The running position controller 71 recognizes the running position of the vehicle detected by the running position detector 61 on a map stored in the RAM 65 and the ROM 66, extracts the traffic information such as a jam information if there is such an information in the FM multiplex signals from the first transmit-receive circuit 64a in accordance with a signal from the operation unit 62 and outputs a specified navigation information and the like. The discriminator 72 discriminates based on the signal from the second transmit-receive circuit 64b whether or not the FM radio 12 is on. The multiplex tuning controller 73 controls, in the case that the discriminator 72 discriminates that the FM radio 12 is on, the tuning of the FM multiplex receiver 11 lest a selected frequency of the FM multiplex receiver 11 should be set to a prohibited frequency fx (=f0+fIF) stored in the ROM 65 or the RAM 66. The operation of the CPU 67 of the main controller 13 is described in detail below.

The operation of the broadcast receiving system constructed as above is described. While a vehicle is running, a driver or fellow passenger receives the FM multiplex broadcast radio wave via the FM multiplex receiver 11. In the main controller 13, a traffic information such as a jam information is extracted if there is such an information in the FM multiplex signal from the first transmit-receive circuit 64a and a specified navigation information or the like is outputted while the running position detected by the running position detector 61 is recognized on a specified map. In such a case, the driver may frequently drive a vehicle while listening to the FM radio.

Generally, in the case that the electric field intensity of the FM radio station is low, two kinds of noises frequently may be induced in the FM radio 12. First, in the case that the FM multiplex receiver 11 is tuned in an auto-scan mode, noise is generated in FM radio broadcasting when an auto-scan frequency passes the frequency of f1+fIF. Second, in the case that the FM multiplex receiver 11 is tuned in a manual mode, noise is constantly included in the sounds from the FM radio 12 if the relationship of the selected frequencies of the FM radio 12 and the FM multiplex receiver 11 is: f1=f0−fIF.

Figure 3A:
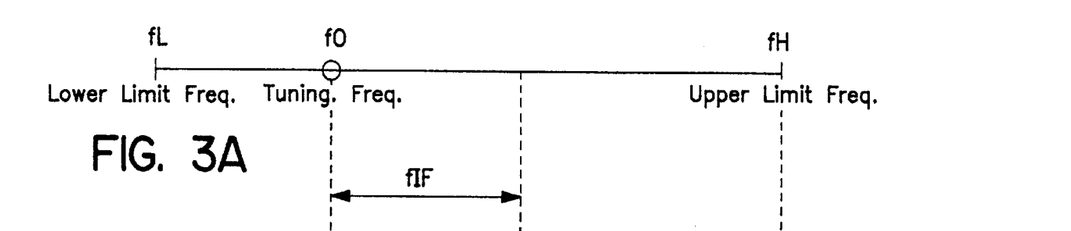
Figure 3B:
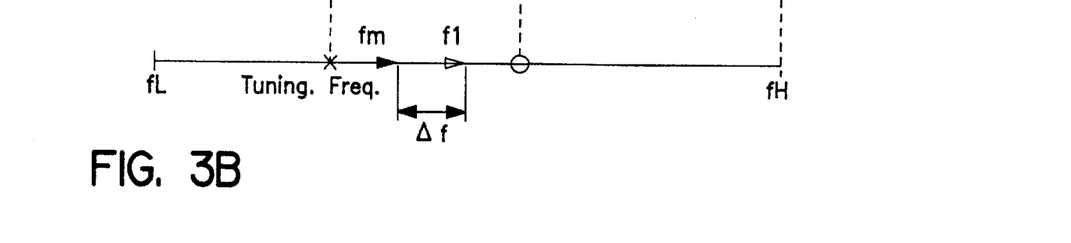

FIGS. 3(a) and 3(b) are charts showing the tuning of the FM radio 12 and the tuning of the FM multiplex receiver 11, respectively.

As an example, if fL, fH denote lower and upper limit frequencies of the FM radio broadcast and of the FM multiplex broadcast as shown in FIG. 3, a relationship fL≦f0≦fH is established since fL=76 MHz, fH=90 MHz, e.g. in Japan. A stepwise frequency change amount Δf for the tuning (hereinafter, "tuning step") is e.g. 0.1 MHz, and an intermediate frequency fIF as a bandwidth from the tuning frequency f0 to the prohibited frequency fx is 10.7 MHz. In this case, since fx=f0+fIF is established, jamming does not occur if the prohibited frequency fx exceeds the upper limit frequency fH, i.e. goes beyond the broadcast band.

When receiving frequency—local oscillation frequency= intermediate frequency (=10.7 MHz fixed), the prohibited frequency is fx=f0+fIF. However, in the case that the FM multiplex receiver 11 is so manufactured as to establish a relationship: local oscillation frequency−receiving frequency=intermediate frequency (=10.7 MHz fixed), the prohibited frequency is fx=f0—fIF. In this case, there is a possibility that the receiving frequency f0 of the FM radio 12 coincides with the prohibited frequency fx. Specifically, noise is disadvantageously generated both in the auto-scan mode and in the manual mode.

Figure 4:
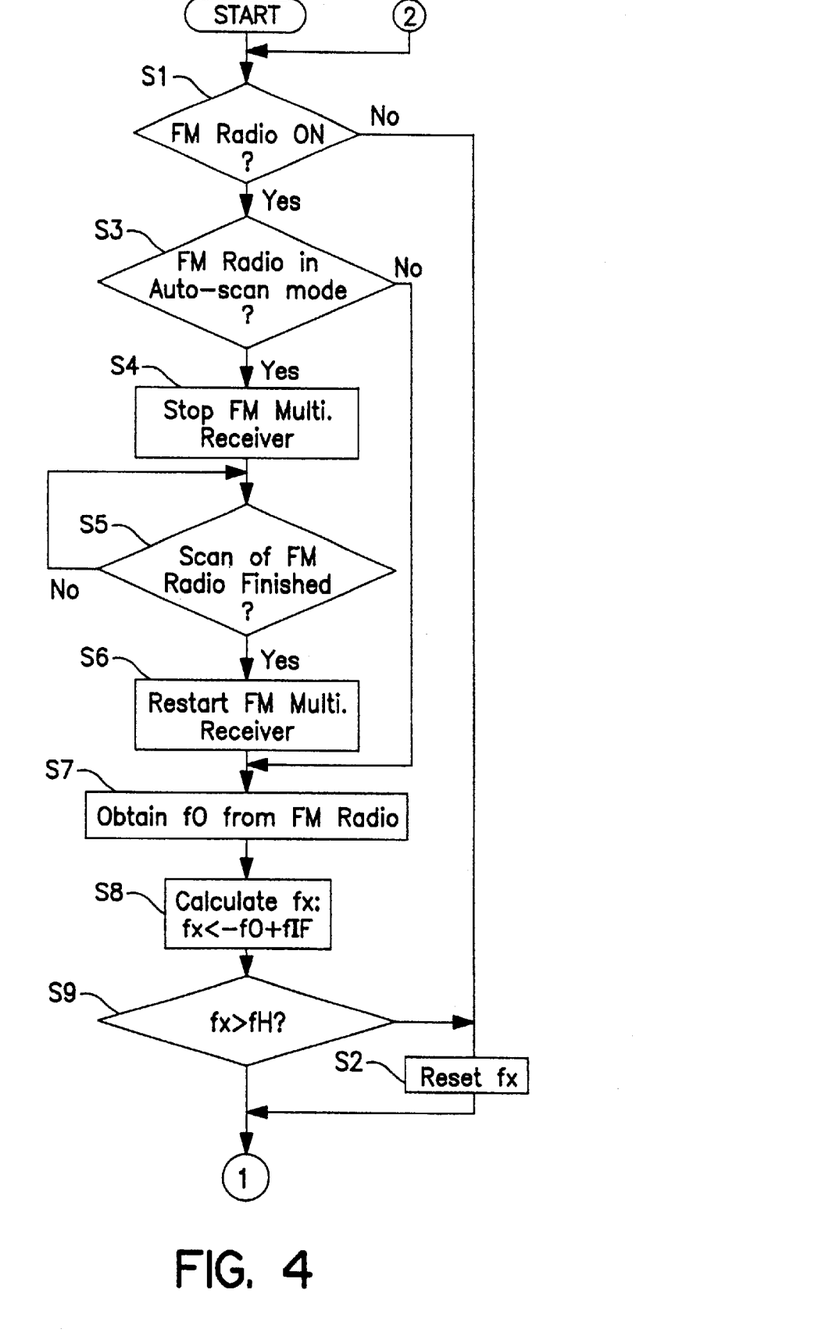
FIG. 4 is a flow chart showing the operation of the broadcast receiving system.
Figure 5:
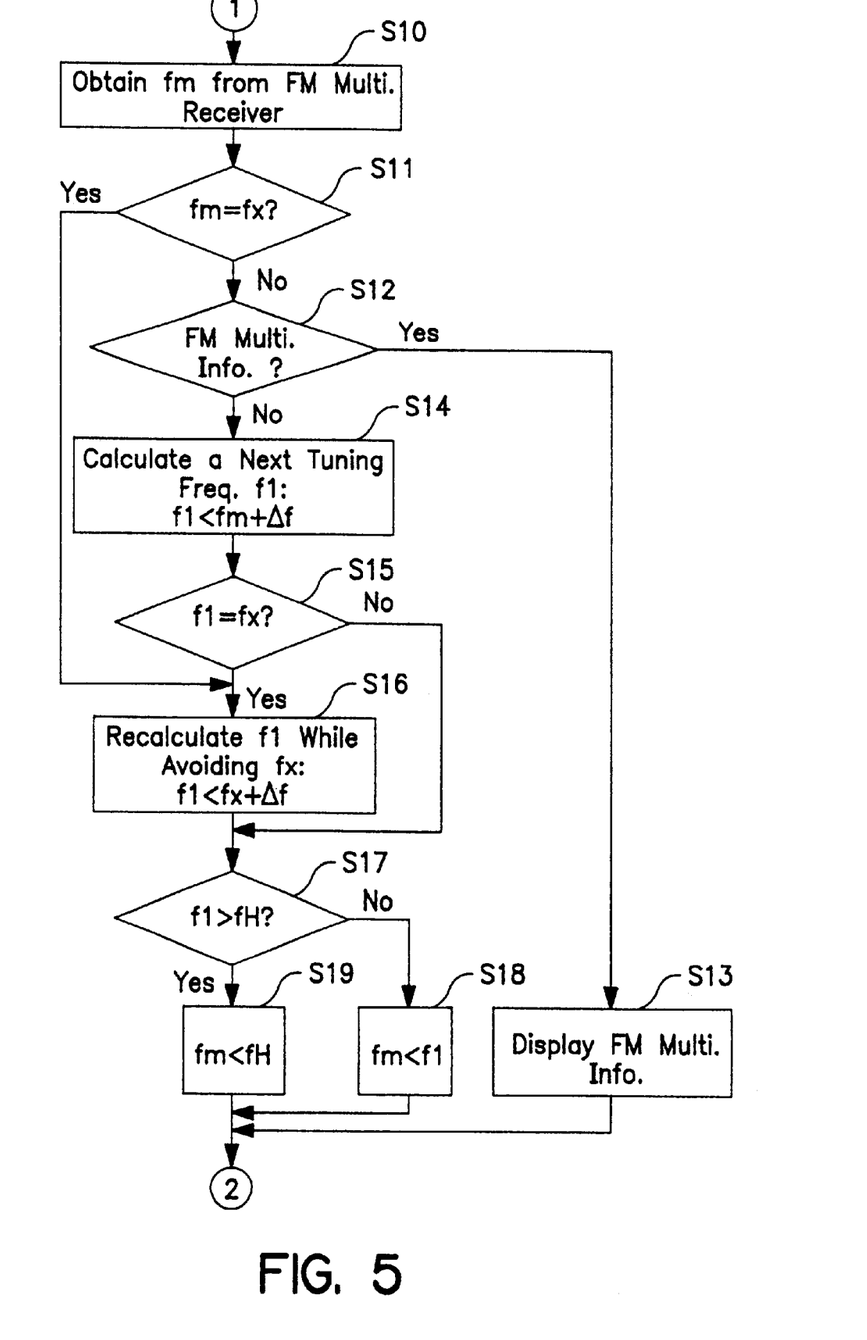
FIG. 5 is a flow chart showing the operation of the broadcast receiving system.

In order to prevent the generation of noise both in the auto-scan mode and in the manual mode, the radio wave reception is performed in a procedure as shown in a flow chart of FIGS. 4 and 5.

First, in the vehicle, when the driver or fellow passenger operates the operation unit 62 to activate the vehicle navigation system, the FM multiplex receiver 11 is turned on by the main controller 13. In Step S1, the CPU 67 of the main controller 13 discriminates by means of the discriminator 72 whether or not the FM radio 12 is on. If the FM radio is off, the prohibited frequency fx of the FM multiplex receiver 11 is reset in Step S2 because of no need to consider the influence of noise.

If the FM radio 12 is discriminated to be on in Step S1, whether or not the FM radio 12 is in the auto-scan mode is discriminated in Step S3. If the auto-scan mode is not set, i.e. the manual mode is set, the tuning frequency f0 is obtained from the FM radio 12 in Step S7 and the prohibited frequency fx of the FM multiplex receiver 11 is calculated in accordance with the following equation in Step S8.

$$fx=f0+fIF=f0+10.7 \text{ MHz}.$$

Subsequently, whether or not the prohibited frequency fx has exceeded the upper limit frequency fH is discriminated in Step S9. If fx>fH, the prohibited frequency fx of the FM multiplex receiver 11 is reset in Step S2.

On the other hand, if the FM radio 12 is discriminated to be in the auto-scan mode in Step S3, the FM multiplex receiver 11 stops its function until the scan operation of the FM radio 12 is completed (Step S4). After the completion of the scan operation of the FM radio 12 (Step S5), the function of the FM multiplex receiver 11 is resumed (Step S6). Thereafter, the prohibited frequency fx is defined as in the aforementioned Steps S7 to S9.

Subsequently, the tuning of the multiplex receiver 11 is started. Here, after a tuning frequency fm is obtained in Step S10, whether or not this tuning frequency fm is equal to the prohibited frequency fx (Step S11) is discriminated.

Upon the discrimination that fm=fx (or |fm−fx|<df, wherein df is a predetermined or predeterminable value, e.g. df=Δf), the operations after Step S16 are performed, skipping the operations of Steps S12 to S15 to be described later. Further, if fx≠fm (NO in Step S11), the presence or absence of an FM multiplex information is discriminated in Step S12. If the FM multiplex information is discriminated to be present, it is displayed in the display 63 in Step S13 after being received. On the other hand, if the FM multiplex information is discriminated to be absent, a next tuning frequency f1 (=fm+Δf) is calculated by the multiplex tuning controller 73 (Step S14) and whether or not the tuning frequency f1 is equal to the prohibited frequency fx is discriminated (Step S15). If f1=fx, after the tuning frequency f1 is recalculated by adding Δf in order to be different from the prohibited frequency fx (Step S16), an information on this frequency f1 is given to the CPU 30 of the FM multiplex receiver 11 via the transmit-receive circuits 64a, 27. The CPU 30 discriminates whether or not the frequency f1 has exceeded the upper limit frequency fH in Step S30. If f1≦fH, the tuning is performed based on the calculated frequency f1 in Step S18. On the other hand, if f1>fH (YES in Step S17), the lower limit frequency fL is chosen as a tuning frequency (Step S19).

In this way, if there is a likelihood that noise is induced in the FM radio 12, the generation of local oscillation can easily be prevented by not selecting the prohibited frequency fx for the FM multiplex receiver 11, without additionally providing an isolation buffer as in the prior art. This prevents the receiving system from becoming larger.

In the foregoing embodiment, the tuning of the FM multiplex receiver 11 is performed by increasing the frequency by continuous and/or stepwise addition of the specified change amount Δf to the lower limit frequency fL. Instead, the tuning may be performed by decreasing the frequency by continuous subtraction of the specified change amount Δf from the upper limit frequency fH while avoiding the prohibited frequency fx.

It should be noted that although only the FM radio is taken as an example of a radio in the foregoing embodiment, a radio having an AM function may be used.

What is claimed is:

1. An information receiving method comprising the steps of:
   providing first and second information receivers for simultaneously receiving radio waves and having tuning frequencies, the first information receiver being an FM multiplex receiver capable of receiving a first information radio wave, the first information radio wave being an FM multiplex broadcast radio wave including traffic information, the second information receiver being a radio for receiving a second information radio wave, the second information radio wave being an FM broadcast radio wave, discriminating whether the first and second information receivers are simultaneously on, establishing a prohibited tuning frequency which is capable of adversely affecting the reception of the second information receiver by local oscillation generated during the reception by the first information receiver, discriminating whether the tuning frequency of the first information receiver is equal to said prohibited frequency, and changing the tuning frequency of the first information receiver in the case that the first and second information receivers are simultaneously on and the tuning frequency of the first information receiver is equal to the prohibited frequency.

2. An infornmation receiving method according to claim 1, wherein the step of changing the tuning frequency of the first information receiver is performed in a continuous manner.

3. An information receiving method according to claim 1, wherein the step of changing the tuning frequency of the first information receiver is performed stepwise by changing said tuning frequency a specified frequency change amount.

4. An information receiving method according to claim 3, further comprising the steps of:

discriminating whether the tuning frequency of the first information receiver has exceeded an upper limit frequency and setting said tuning frequency to a lower limit frequency if this is the case, and the frequency change amount by which said tuning frequency is changed is positive; and discriminating whether the tuning frequency of the first information receiver has exceeded a lower limit frequency and setting said tuning frequency to an upper limit frequency if this is the case, in case, and the frequency change amount by which said tuning frequency is changed is negative.

5. An information receiving method according to claim 1, further comprising the steps of obtaining a tuning frequency of the second information receiver and calculating the prohibited frequency based on the obtained tuning frequency.

6. An information receiving method according to claim 5, further comprising the step of renewably storing the calculated prohibited frequency.

* * * * *